United States Patent
Li

(10) Patent No.: US 9,583,605 B2
(45) Date of Patent: Feb. 28, 2017

(54) METHOD OF FORMING A TRENCH IN A SEMICONDUCTOR DEVICE

(71) Applicant: Changzhou ZhongMin Semi-Tech Co. Ltd., Changzhou (CN)

(72) Inventor: Yuzhu Li, Jintan (CN)

(73) Assignee: Changzhou ZhongMin Semi-Tech Co. Ltd, Changzhou (CN)

( * ) Notice: Subject to any disclaimer, the term of this patent is extended or adjusted under 35 U.S.C. 154(b) by 0 days.

(21) Appl. No.: 15/016,255

(22) Filed: Feb. 4, 2016

(65) Prior Publication Data

US 2016/0233105 A1 Aug. 11, 2016

Related U.S. Application Data

(60) Provisional application No. 62/112,265, filed on Feb. 5, 2015, provisional application No. 62/126,937, filed (Continued)

(51) Int. Cl.
| | | |
|---|---|---|
| *H01L 21/02* | (2006.01) | |
| *H01L 21/203* | (2006.01) | |
| *H01L 21/308* | (2006.01) | |
| *H01L 21/04* | (2006.01) | |
| *H01L 29/739* | (2006.01) | |

(Continued)

(52) U.S. Cl.
CPC ...... *H01L 29/7397* (2013.01); *H01L 21/0217* (2013.01); *H01L 21/02164* (2013.01); *H01L 21/02236* (2013.01); *H01L 21/0475* (2013.01); *H01L 21/3081* (2013.01); *H01L 21/3086* (2013.01); *H01L 21/30604* (2013.01); *H01L 21/31111* (2013.01); *H01L 23/53271* (2013.01); *H01L 29/0696* (2013.01); *H01L 29/0804* (2013.01); *H01L 29/0821* (2013.01); *H01L 29/1095* (2013.01); *H01L 29/16* (2013.01); *H01L 29/1608* (2013.01); *H01L 29/2003* (2013.01); *H01L 29/4236* (2013.01);

(Continued)

(58) Field of Classification Search
CPC ......... H01L 21/30604; H01L 21/02164; H01L 21/0475; H01L 23/481; H01L 29/06
USPC .......................................................... 438/701
See application file for complete search history.

(56) References Cited

U.S. PATENT DOCUMENTS

| | | | | |
|---|---|---|---|---|
| 2006/0105526 A1* | 5/2006 | Kwon | ............... | H01L 29/66181 438/268 |
| 2007/0205489 A1* | 9/2007 | Tilke | ................. | H01L 21/76229 257/618 |
| 2011/0195565 A1* | 8/2011 | Mueller | ............... | H01L 21/743 438/586 |

* cited by examiner

Primary Examiner — Moazzam Hossain
Assistant Examiner — Omar Mojaddedi
(74) Attorney, Agent, or Firm — Edward S. Sherman

(57) ABSTRACT

A method to make a semiconductor device, a first $SiO_2$ layer and a first $Si_3N_4$ layer are sequentially formed on the semiconductor substrate. The first $SiO_2$ layer and the first $Si_3N_4$ layer are then patterned as etching mask to form a trench in a semiconductor substrate by a trench etching process. After this, a second $SiO_2$ layer and a second $Si_3N_4$ layer are formed conformal onto the substrate. Anisotropic etching is then performed to remove the second $Si_3N_4$ and second $SiO_2$ layer except on the trench sidewall. Then a thermal oxidation process is done to grow oxide only in trench bottom and at trench top corner. The radius of curvature of trench bottom and trench top corner is increased at the same time by this thermal oxidation process.

11 Claims, 7 Drawing Sheets

Related U.S. Application Data on Mar. 2, 2015, provisional application No. 62/126,961, filed on Mar. 2, 2015, provisional application No. 62/148,921, filed on Apr. 17, 2015.

(51) Int. Cl.
*H01L 21/306* (2006.01)
*H01L 21/311* (2006.01)
*H01L 29/06* (2006.01)
*H01L 23/532* (2006.01)
*H01L 29/16* (2006.01)
*H01L 29/20* (2006.01)
*H01L 29/423* (2006.01)
*H01L 29/49* (2006.01)
*H01L 29/08* (2006.01)
*H01L 29/10* (2006.01)

(52) U.S. Cl.
CPC .... *H01L 29/4916* (2013.01); *H01L 21/02238* (2013.01); *H01L 21/02255* (2013.01)

METHOD OF FORMING A TRENCH IN A SEMICONDUCTOR DEVICE

CROSS REFERENCE TO RELATED APPLICATIONS

The present application claims the benefit of priority to the US Provisional patent application of the same title that was filed on Feb. 5, 2015, having application Ser. No. 62/112,256, and is incorporated herein by reference.

The present application also claims the benefit of priority to the US Provisional patent application of the same title that was filed on Mar. 2, 2015, having application Ser. No. 62/126,937, and is incorporated herein by reference.

The present application also claims the benefit of priority to the US Provisional patent application of the same title that was filed on Mar. 2, 2015, having application Ser. No. 62/126,961, and is incorporated herein by reference.

The present application also claims the benefit of priority to the US Provisional patent application of the same title that was filed on Apr. 17, 2015, having application Ser. No. 62/148,921, and is incorporated herein by reference.

BACKGROUND OF INVENTION

1. Field of the Invention

The present invention relates to a method for making trenches in a semiconductor device, and more particularly to a method of increasing the radius of curvature of trench bottom and trench top corner.

2. Related Background Art

There is a trend for high voltage semiconductor device including MOS (metal-oxide-semiconductor) type and IGBT (Insulated Gate Bipolar Transistor) type to use trench cell structure. Compared with planar cell structure, trench cell structure can achieve higher packing density and lower forward saturation voltage. However, trench structure device has two problems. Firstly, the electric field tends to concentrate on the trench bottom, negatively impacting device's HTRB (high temperature reverse bias) reliability performance. Secondly, trench top corners have a sharp, almost square shape, causing gate leakage problems. So there is a need to increase the radius of curvature of both trench bottom and trench top corner.

In an attempt to increase the radius of curvature for trench bottom, an isotropic etching is performed to round the trench bottom corner while the trench sidewall is protected by a previously deposited reaction product as disclosed in U.S. Pat. No. 6,521,538 B2 (which issued to Soga et al. on Feb. 18, 2003), which is incorporated herein by reference and is hereinafter referred to as the '538 patent. However, this method of rounding the trench bottom corner has limited efficiency because the isotropic etching process is difficult to control.

Therefore, instead of isotropic etching process, others have proposed a method using thermal oxidation process to enlarge the size of the trench bottom as disclosed in U.S. Pat. No. 8,659,065 B2 (which issued to Sumitomo et al. on Feb. 25, 2014), which is incorporated herein by reference and is hereinafter referred to as the '065 patent. This method does meet the requirement of using a highly controllable process like thermal oxidation, but this method still has two drawbacks. Firstly it needs two separate silicon trench etching steps, increasing process complexity and the cost of manufacturing. Secondly, the trench top corner still has a sharp, almost square shape.

To overcome the shortcomings, the present invention intends to provide an improved method using thermal oxidation process to increase the radius of curvature of the trench bottom, and at the same time the trench top corner is rounded.

The above and other objects, effects, features, and advantages of the present invention will become more apparent from the following description of the embodiments thereof taken in conjunction with the accompanying drawings

SUMMARY OF INVENTION

The primary objective of the present invention is to provide a method to simultaneously increase both the radius of curvature at the trench bottom and at the trench top corner by using a highly controllable process.

According one aspect of the present invention, the method uses a first $SiO_2$ layer and a first $Si_3N_4$ layer as etching mask to form a trench into the semiconductor substrate. Then a second $SiO_2$ layer and a second $Si_3N_4$ layer are added conformally coat to the semiconductor substrate after the trench etching. Then an anisotropic dry etching is performed to remove the second $Si_3N_4$ layer and the second $SiO_2$ layer except on the trench sidewall. After a thermal oxidation process, thermal oxide is grown in the trench bottom and trench top corner, and thus both the radius of curvature at trench bottom and at trench top corner is increased.

The above and other objects, effects, features, and advantages of the present invention will become more apparent from the following description of the embodiments thereof taken in conjunction with the accompanying drawings.

DETAILED DESCRIPTION

Figure 1:
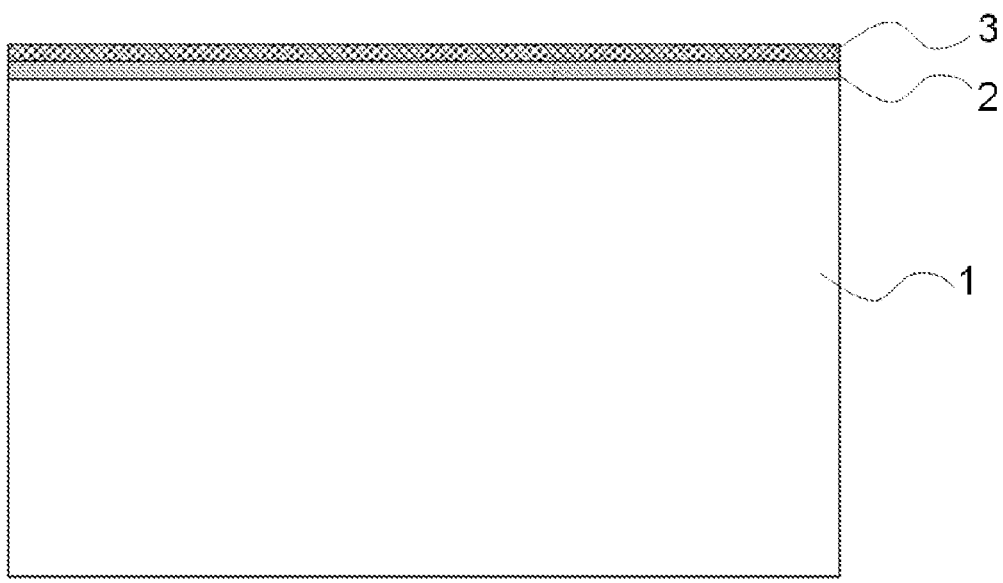
FIG. 1 schematically illustrates a semiconductor substrate with a first $SiO_2$ and a first $Si_3N_4$ layer already formed on the top surface.

Referring to FIGS. 1 through 7, wherein like reference numerals refer to like components in the various views.

Some embodiments of the present invention will be described hereafter with reference to the drawings. Drawings FIG. 1-7 are schematic cross-sectional elevation views of a semi-conductor substrate to illustrate the sequence of process steps in forming trenches inside the substrate. No intent is made to illustrate specific size or proportions, as these will be well understood by those skilled in the art of such semi-conductor devices with the aid of the following descriptions.

The method comprises the following steps.

With reference to FIG. 1, there is provided with a semi-conductor substrate 1 and the first step is to form a first $SiO_2$ layer 2 on the top surface of substrate 1, and then the first $Si_3N_4$ layer 3 on the top of the first $SiO_2$ layer 2. The first $SiO_2$ layer 2 can be formed either by a thermal oxidation process or by a CVD (chemical vapor deposition) process. The first $Si_3N_4$ layer 3 can be formed by a CVD process. The layers should be deposited with a process that produces an isotropic or conformal coating, and may also be deposited by an ALD process (Atomic Layer Deposition).

Figure 2:
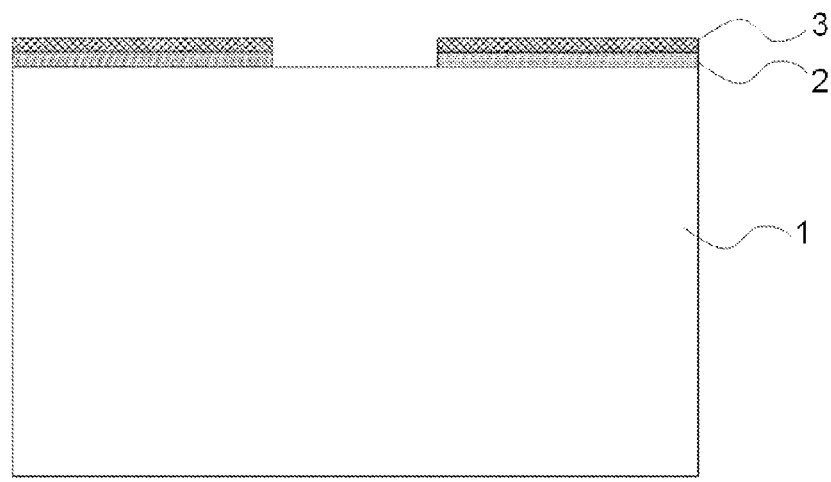
FIG. 2 schematically illustrates the patterning of the first $SiO_2$ and the first $Si_3N_4$ layer to define a trench etching mask.

Then in the next step, lithography and etching process is performed to pattern the first $SiO_2$ layer 2 and the first $Si_3N_4$ layer 3, with the result shown in FIG. 2.

Figure 3:
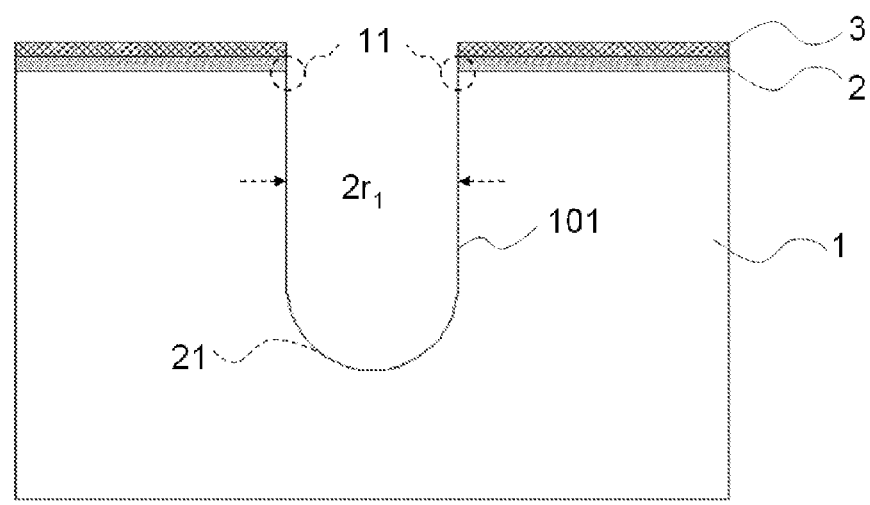
FIG. 3 schematically illustrates the forming of a trench into the substrate by a first etching process, using the first $SiO_2$ and the first $Si_3N_4$ layer as the etching mask.

The next step is to etch trench 101 into the substrate 1, with the result shown in FIG. 3. This trench etching step uses the first $SiO_2$ layer 2 and the first $Si_3N_4$ layer 3 as an etching mask. The resulting trench 101 has top corners 11, having a sharp, almost square shape. The trench 101 has a width of $2r_1$. The trench bottom 21 has a radius of curvature of about $r_1$.

Figure 4:
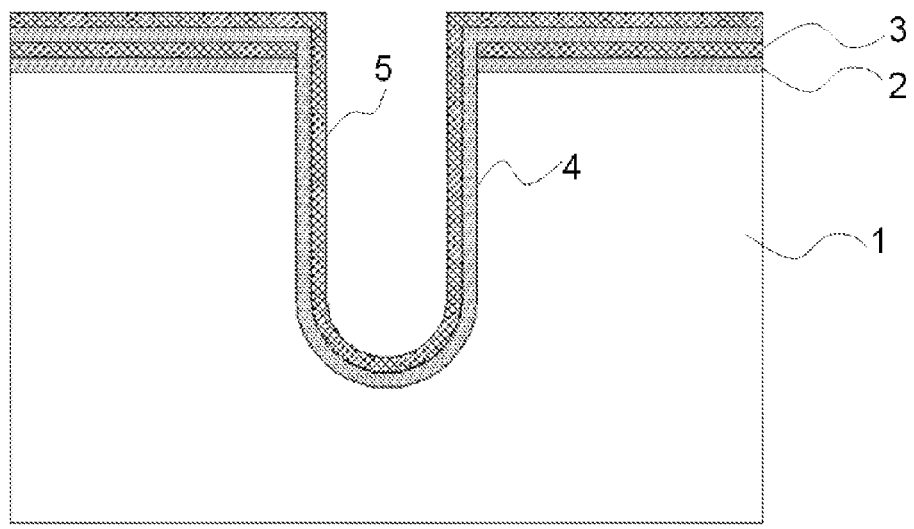
FIG. 4 schematically illustrates the trench structure after the deposition of the second $SiO_2$ and the second $Si_3N_4$ layer on the substrate.

After the trench is etched, in a subsequent step, a second $SiO_2$ layer 4 and a second $Si_3N_4$ layer 5 are formed conformal to the substrate, with the result of this step illustrated by FIG. 4. The second $SiO_2$ layer 4 and the second $Si_3N_4$ layer 5 can be formed by CVD or ALD process.

Figure 5:
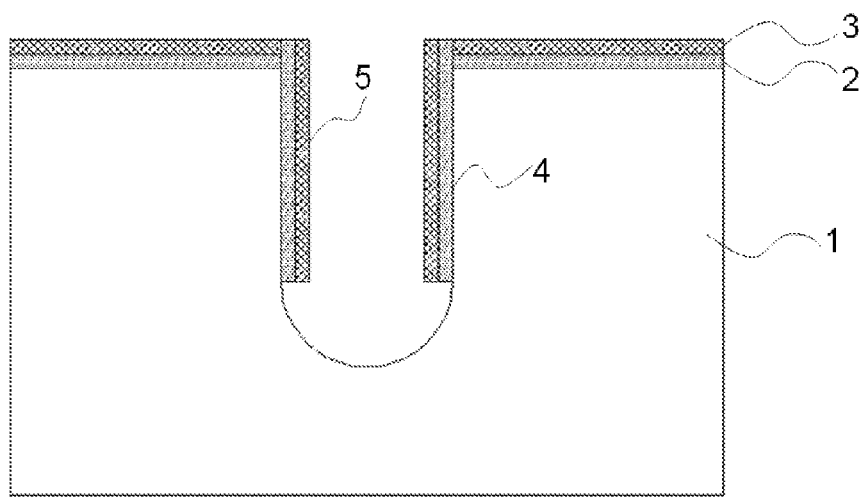
FIG. 5 schematically illustrates the trench structure after the removal of the second $Si_3N_4$ and the second $SiO_2$ layer except on the trench sidewall.

Then, in a subsequent step, anisotropic etching is done to sequentially to remove the second $Si_3N_4$ layer 5 and the second $SiO_2$ layer 4 except on the trench sidewall, with the result of this step shown in FIG. 5. Such anisotropic etching is readily conducted in commercial semi-conductor processing equipment, such as a LAM 4300 etching apparatus as a non-limiting example, and preferably under dry etching conditions with thriflouromethane ($CHF_3$) gas.

Figure 6:
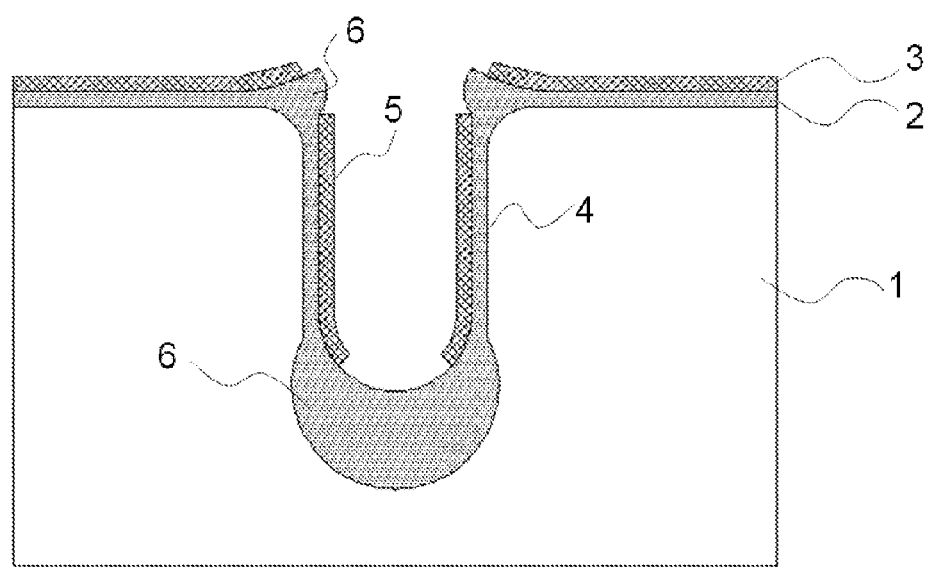
FIG. 6 schematically illustrates the result of the thermal oxidation process to grow oxide in the trench bottom and trench top corner.

The next step is a thermal oxidation process. Thermal oxidation of silicon preferably occurs at about 1,050° C. using water vapor as the oxidizer, rather than dry oxygen. The $Si_3N_4$ layers 3 and 5 are impermeable to the oxidizing agents, while the oxidizing agents can penetrate the $SiO_2$ layer 2 and 4. The Si substrate at the bottom of the trench is no longer protected by second pair of $Si_3N_4$ and $SiO_2$ layers ($Si_3N_4$ layer 5 and $SiO_2$ layer 4). However, the removal of the planar portions of the $Si_3N_4$ layer 5 and $SiO_2$ layer 4 at the top of the substrate leaves a very thin $SiO_2$ edge at the top corners of the trench which very short oxygen diffusion path. Therefore, the thermal oxide 6 grows fastest in the trench bottom and slightly slower in trench top corners, as shown in FIG. 6, where the oxygen more readily diffuses through the thin $SiO_2$ layer 4 that was not consumed in the anisotropic etching. The slower diffusion of oxidizing agent in the $SiO_2$ layer 4 down the sidewalls under the $Si_3N_4$ layer 5 more slowly expands the $SiO_2$ thickness in the sidewalls as Si is consumed. As this thermal oxidation process consumes the Si or other semiconductor material in the trench bottom and at trench top corner faster than in the sidewalls, it also changes the shape of the trench, rounding otherwise sharp corners and increasing the curvature of the bottom. The size increase of the bottom radius from $r_1$ to $r_2$ is readily controlled by oxidation time under these conditions. As the Si at the trench corner is consumed by growing $SiO_2$ the approximately 2.4:1 thermal expansion causes the upper planar $Si_3N_4$ layer 5 at the trench corner to lift away from $Si_3N_4$ layer 5 on the sidewalls. Simulations of trench formation and etching processes disclosed herein indicate a minute thermal oxidation time for this step expands the trench radius from 0.4 μm to 0.6 μm, resulting in a trench with a width of 0.8 μm ($2 \times r_1$) and a depth of about 5 μm. Conditions for other trench sizes, aspect ratios and local curvature can readily be determined by such simulations by varying initial sizes and etch times.

Figure 7:
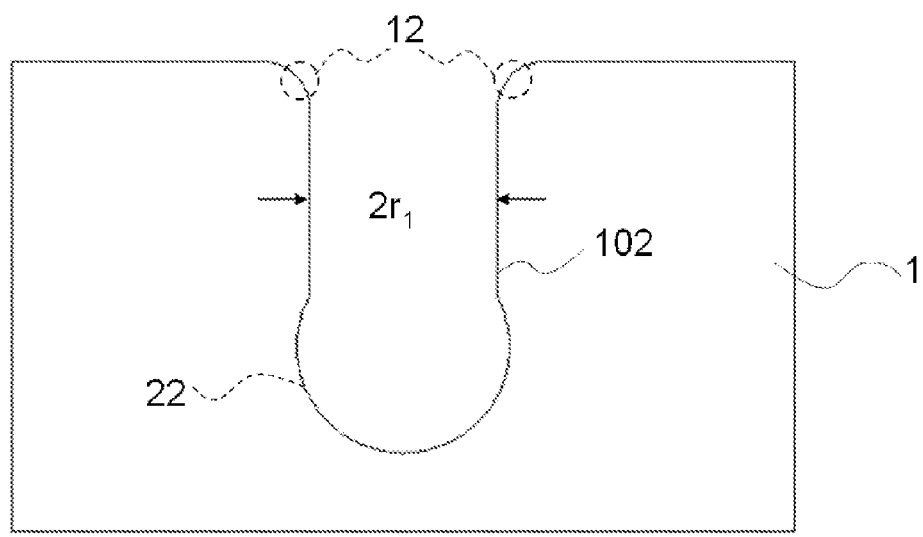
FIG. 7 schematically illustrates the substrate after removing all $Si_3N_4$ and $SiO_2$ layer. The trench is clearly shown with increased radius of curvature at both trench bottom and at trench top corner.

In the next step, all $Si_3N_4$ layers and $SiO_2$ layers are stripped by wet etching or CDE (chemical dry etching) process, to provide the result shown in FIG. 7. It can be clearly seen that, the trench 102 has different shape than trench 101. The trench top 12 is rounded. The width of trench 102 is still $2 \times r_1$. The trench bottom 22 has a radius of curvature larger than $r_1$. Therefore, both the radius of curvature at trench bottom and at trench top corner is increased. The trench depth can be readily increased beyond 5 μm by increasing the initial etch depth through the mask opening formed in the initial $Si_3N_4$ layer 3 and the first $SiO_2$ layer 2.

Although the present invention has been described in relation to particular embodiments thereof, many other variations and modifications and other uses will become apparent to those skilled in the art. For example, semiconductor substrate material provided in this invention can be selected from the group of materials that consist of silicon and silicon carbide. While the invention has been described in connection with a preferred embodiment, it is not intended to limit the scope of the invention to the particular form set forth, but on the contrary, it is intended to cover such alternatives, modifications, and equivalents as may be within the spirit and scope of the invention as defined by the appended claims.

I claim:

1. A method of forming a trench in a semi-conductor substrate, the method comprising the steps of:
   a) providing a semiconductor substrate with a planar surface with a first SiO2 layer disposed on the planar surface thereof, and a first Si3N4 layer on the first SiO2 layer,
   b) patterning the first SiO2 layer and the first Si3N4 layer by lithography and etching;
   c) etching a trench into the substrate using the first SiO2 layer and a first Si3N4 layer as an etching mask;
   d) depositing a second SiO2 conformal layer on the side of the substrate having the trench,
   e) depositing a second Si3N4 conformal layer on the side of the substrate having the trench,
   f) anisotropically etching the side of the substrate having the trench to remove the second Si3N4 layer and the second SiO2 layer on substrate surfaces that are parallel to the planar substrate surface wherein the trench sidewall retain at least a portion of the second Si3N4 layer and the second SiO2 layer,
   g) thermally oxidizing the side of the substrate having the trench to an extent necessary to grow thermal oxide in a trench bottom and at a trench top corner;
   h) removing all Si3N4 layers and SiO2 layers.

2. The method of claim 1, wherein the semiconductor substrate material is selected from the group consisting of silicon and silicon carbide.

3. The method of claim 1 wherein said step of anisotropically etching the side of the substrate having the trench to remove the second Si3N4 layer and the second SiO2 layer on substrate surfaces that are parallel to the planar substrate surface provides for the entire trench sidewalls to remain protected from oxidation in step g) by the second Si3N4 layer and the second SiO2 layer.

4. The method of claim 1 wherein said step of anisotropically etching the side of the substrate having the trench to remove the second Si3N4 layer and the second SiO2 layer on substrate surfaces that are parallel to the planar substrate surface exposes a junction of the first and second SiO2 layers.

5. The method of claim 1 wherein said step g) of thermally oxidizing the side of the substrate having the trench to an extent necessary to grow thermal oxide in a trench bottom and at a trench top corner occurs after said step f) of anisotropically etching the side of the substrate having the trench to remove the second Si3N4 layer and the second SiO2 layer on substrate surfaces that are parallel to the planar substrate surface wherein the trench sidewall retain at least a portion of the second Si3N4 layer and the second SiO2 layer.

6. The method of claim 1 wherein said step g) of thermally oxidizing the side of the substrate having the trench to an extent necessary to grow thermal oxide in a trench bottom and at a trench top corner occurs immediately after said step f) of anisotropically etching the side of the substrate having the trench to remove the second Si3N4 layer and the second SiO2 layer on substrate surfaces that are parallel to the planar substrate surface wherein the trench sidewall retain at least a portion of the second Si3N4 layer and the second SiO2 layer.

7. The method of claim 1 wherein said step of etching a trench into the substrate using the first SiO2 layer and a first Si3N4 layer as an etching mask form a round bottom of the resulting trench.

8. The method of claim 7 wherein said step of etching a trench into the substrate using the first SiO2 layer and a first Si3N4 layer as an etching mask form a trench with a bottom having radius that half the width of the trench.

9. The method of claim 1 wherein substrate is silicon and the silicon at a trench corner is consumed by growing SiO2 in step g) causing the first Si3N4 layer at the trench corner to lift away from first Si3N4 layer on the trench sidewalls.

10. The method of claim 1 wherein the step of thermally oxidizing in step g) expand the trench radius by at least about 50%.

11. The method of claim 1 wherein the resulting trench has a depth of about 5 microns and a width of about 0.8 microns.

* * * * *